(12) United States Patent
Ishibashi

(10) Patent No.: US 11,261,346 B2
(45) Date of Patent: Mar. 1, 2022

(54) POLISHING COMPOSITION

(71) Applicant: FUJIMI INCORPORATED, Kiyosu (JP)

(72) Inventor: Tomoaki Ishibashi, Kiyosu (JP)

(73) Assignee: FUJIMI INCORPORATED, Kiyosu (JP)

( * ) Notice: Subject to any disclaimer, the term of this patent is extended or adjusted under 35 U.S.C. 154(b) by 147 days.

(21) Appl. No.: 16/090,195

(22) PCT Filed: Mar. 22, 2017

(86) PCT No.: PCT/JP2017/011527
§ 371 (c)(1),
(2) Date: Sep. 28, 2018

(87) PCT Pub. No.: WO2017/170062
PCT Pub. Date: Oct. 5, 2017

(65) Prior Publication Data
US 2019/0112506 A1  Apr. 18, 2019

(30) Foreign Application Priority Data
Mar. 31, 2016  (JP) .............................. JP2016-071478

(51) Int. Cl.
| | | |
|---|---|---|
| C09G 1/02 | (2006.01) | |
| H01L 21/304 | (2006.01) | |
| C09K 3/14 | (2006.01) | |
| H01L 21/02 | (2006.01) | |

(52) U.S. Cl.
CPC .............. *C09G 1/02* (2013.01); *C09K 3/1445* (2013.01); *H01L 21/02024* (2013.01); *H01L 21/304* (2013.01); *C09K 3/1436* (2013.01)

(58) Field of Classification Search
CPC .......... C09G 1/02; C09G 1/00; C09K 3/1436; C09K 3/1445; H01L 21/02024; H01L 21/304; C23F 1/10
USPC .... 252/79.1, 79.2, 79.3, 79.4; 438/692, 693, 438/694
See application file for complete search history.

(56) References Cited

U.S. PATENT DOCUMENTS

| | | | | |
|---|---|---|---|---|
| 2004/0134873 | A1* | 7/2004 | Yao | ..................... H01L 21/3212 216/2 |
| 2005/0003743 | A1 | 1/2005 | Minamihaba et al. | |
| 2005/0037936 | A1* | 2/2005 | Martyak | ............. H01L 21/3212 510/175 |
| 2005/0118821 | A1 | 6/2005 | Minamihaba | |
| 2005/0266689 | A1* | 12/2005 | Small | ................... H01L 21/3212 438/693 |
| 2010/0301146 | A1* | 12/2010 | Chang | ..................... B02C 17/20 241/21 |
| 2011/0223840 | A1 | 9/2011 | Morinaga et al. | |
| 2012/0142258 | A1 | 6/2012 | Morinaga | |
| 2013/0324015 | A1 | 12/2013 | Asano | |
| 2014/0038348 | A1* | 2/2014 | Kim | ...................... H01L 21/465 438/99 |
| 2016/0060488 | A1* | 3/2016 | Singh | ................... C09K 3/1436 216/53 |

FOREIGN PATENT DOCUMENTS

| | | |
|---|---|---|
| JP | 2004-342751 A | 12/2004 |
| JP | 2005-159166 A | 6/2005 |
| JP | 2009-028814 A | 2/2009 |
| JP | 2011-183530 A | 9/2011 |
| JP | 2011-211178 A | 10/2011 |
| JP | 5098483 B2 | 12/2012 |
| JP | 2015-011735 A | 1/2015 |
| TW | 200532008 A | 10/2005 |
| TW | 201237155 A1 | 9/2012 |
| WO | WO-2012/115020 A1 | 8/2012 |
| WO | WO-2015/170743 A1 | 11/2015 |
| WO | WO-2016/043088 A1 | 3/2016 |
| WO | WO-2016/043089 A1 | 3/2016 |
| WO | WO-2015/129776 A1 | 3/2017 |

OTHER PUBLICATIONS

Office Action issued in corresponding Japanese Application No. 2016-071478 dated Oct. 24, 2019 with English translation.
International Search Report and Written Opinion received in International Application No. PCT/JP2017/011527 dated May 9, 2017.
Office Action issued in corresponding Chinese Patent Application No. 201780007120.6 dated Nov. 28, 2019 with English translation.
Office Action issued in corresponding Japanese Patent Application No. 2016-071478 dated Jan. 23, 2020 with English translation.
Office Action issued in corresponding Taiwanese Patent Application No. 106110855 dated Jun. 4, 2020.
Office Action issued in corresponding Chinese Patent Application No. 201780007120.6, dated Jun. 22, 2020, with English translation.

* cited by examiner

*Primary Examiner* — Lan Vinh
(74) *Attorney, Agent, or Firm* — Foley & Lardner LLP

(57) ABSTRACT

The present invention provides a polishing composition for use in polishing a material having a Vickers hardness of 1500 Hv or higher. The polishing composition comprises an alumina abrasive and water. The alumina abrasive has an isoelectric point that is below 8.0 and is lower than the pH of the polishing composition.

12 Claims, No Drawings

POLISHING COMPOSITION

CROSS-REFERENCE TO RELATED APPLICATIONS

This application is a National Phase of International Patent Application No. PCT/JP2017/011527, filed Mar. 22, 2017, which claims priority to Japanese Patent Application No. 2016-071478, filed Mar. 31, 2016. The contents of these applications are herein incorporated by reference in their entirety.

TECHNICAL FIELD

The present invention relates to a polishing composition. In particular, it relates to a polishing composition used in polishing a material to be polished (a polishing object).

The present International Application claims priority to Japanese Patent Application No. 2016-071478 filed on Mar. 31, 2016; and the entire content thereof is incorporated herein by reference.

BACKGROUND ART

With respect to materials such as diamond, sapphire (aluminum oxide), silicon carbide, boron carbide, tungsten carbide, silicon nitride and titanium nitride, surfaces are typically processed by polishing (lapping) processes in which diamond abrasives are supplied to polishing platens. However, in lapping processes that use diamond abrasives, scratching is likely to occur on surface of lapped objects. In addition, diamond abrasive particles are left on surfaces of lapped objects. Thus, the surfaces of lapped objects are likely to suffer defects and deformation. Accordingly, studies are underway for a polishing process that is carried out after diamond lapping, using a polishing pad and polishing slurry supplied to the interface between the polishing pad and a polishing object. Alternatively, substituting polishing for the lapping has been examined. Publications disclosing this type of conventional art include Patent Document 1.

CITATION LIST

Patent Literature

[Patent Document 1] Japanese Patent Application Publication No. 2011-211178

SUMMARY OF INVENTION

Technical Problem

Lately, higher-quality surfaces are required of polished articles of silicon carbide and the like (e.g. semiconductor substrates and other substrates). Thus, there is a demand for a polishing composition that can satisfy a level of polishing removal rate required for practical use while achieving a polished surface with fewer scratches (scars caused by polishing). Here, the polishing removal rate means the amount (thickness) of surface of polishing object removed per unit time.

The present invention has been made under these circumstances with a primary objective to provide a polishing composition capable of effectively reducing the number of scratches present on a polished surface while maintaining a high polishing removal rate. Another related objective is to provide a method for producing a polished object using the polishing composition.

Solution to Problem

The present invention provides a polishing composition for polishing a material having a Vickers hardness of 1500 Hv or higher. The polishing composition comprises an alumina abrasive and water. The alumina abrasive has an isoelectric point that is below 8.0 and is lower than the pH of the polishing composition.

The use of the alumina abrasive having an isoelectric point that is 8.0 and lower than the pH of the polishing composition can effectively reduce the number of scratches present on the polished surface while maintaining a high polishing removal rate.

The present invention also provides a method for producing a polished object. The production method comprises polishing an object having a Vickers hardness of 1500 Hv or higher, supplying a polishing composition disclosed herein to the object. The production method can efficiently provide a polished object having a high-quality surface with greatly reduced scratches.

DESCRIPTION OF EMBODIMENTS

Preferred embodiments of the present invention are described below. Matters necessary to practice this invention other than those specifically referred to in this description may be understood as design matters based on the conventional art in the pertinent field for a person of ordinary skill in the art. The present invention can be practiced based on the contents disclosed in this description and common technical knowledge in the subject field.

<Polishing Object>

The polishing composition disclosed herein is used for polishing a super-hard material having a Vickers hardness of 1500 Hv or higher. The Vickers hardness of the material to be polished (material subject to polishing) is preferably 1800 Hv or higher (e.g. 2000 Hv or higher, typically 2200 Hv or higher). The maximum Vickers hardness is not particularly limited. It can be about 7000 Hv or lower (e.g. 5000 Hv or lower, typically 3000 Hv or lower). In the present description, Vickers hardness can be determined based on JIS R 1610:2003 to which International standard ISO 14705:2000 corresponds.

Examples of the material having a Vickers hardness of 1500 Hv or higher include diamond, sapphire (aluminum oxide), silicon carbide, boron carbide, zirconium carbide, tungsten carbide, silicon nitride, titanium nitride, and gallium nitride. The polishing composition disclosed herein can be preferably applied to single crystal surfaces of these mechanically- and chemically-stable materials. In particular, the surface to be polished is preferably formed of silicon carbide. Silicon carbide is expected as a material for semiconductor substrates with little power loss, excellent heat resistance, etc. It is particularly advantageous for practical use to improve surface conditions of silicon carbide substrates. The polishing composition disclosed herein is particularly preferably applied to a single crystal silicon carbide surface.

<Polishing Composition>

(Abrasive)

The polishing composition disclosed herein is used for polishing the aforementioned materials subject to polishing, with the polishing composition comprising an alumina abrasive and water. The alumina abrasive has an isoelectric point (or "$IEP_{Al}$" hereinafter) that is below 8.0 and is lower than the pH of the polishing composition. By this, with respect to a super-hard material surface, while maintaining a high polishing removal rate, the number of scratches on the polished surface can be effectively reduced. Such effect may be obtained for a reason such as follows: In general, the surface of a super hard material such as silicon carbide tends to be negatively charged in a polishing composition. The alumina abrasive having an isoelectric point that is below 8.0 and is lower than the pH of the polishing composition is also negatively charged in the polishing composition. Thus, a suitable level of electrostatic repulsion between the negative charges leads to repulsion between alumina particles and the surface of the material subject to polishing. As a result, alumina particles can efficiently remove the surface of the material subject to polishing while avoiding excessive removal of the surface. It can further reduce polishing damages such as scratches caused by polishing. This presumably contributes to an increase in polishing removal rate and improvement in surface quality. However, interpretations are not limited to this reason alone.

From the standpoint of further reducing scratches, etc., the alumina abrasive's $IEP_{Al}$ is lower than the pH of the polishing composition' (or simply "$pH_{com}$" hereinafter), preferably by at least 0.5, more preferably by at least 1.0, yet more preferably by at least 1.5, or particularly preferably by at least 2.0. From the standpoint of the polishing removal rate, etc., the value of $pH_{com}$ minus $IEP_{Al}$ (i.e. $pH_{com}-IEP_{Al}$) can be, for instance, 5.0 or less; it is preferably 4.5 or less, more preferably 4.0 or less, yet more preferably 3.5 or less, or particularly preferably 3.0 or less. For instance, $pH_{com}-IEP_{Al}$ can be 2.8 or less.

From the standpoint of combining a polishing removal rate and surface quality, the relationship between $IEP_{Al}$ and $pH_{com}$ preferably satisfies $0.4<IEP_{Al}/pH_{com}<1$, more preferably satisfies $0.5 \leq IEP_{Al}/pH_{com} \leq 0.9$, or yet more preferably satisfies $0.6 \leq IEP_{Al}/pH_{com} \leq 0.8$. With the use of an alumina abrasive that satisfies such an $IEP_{Al}/pH_{com}$ ratio, while maintaining a high polishing removal rate, the number of scratches on the polished surface can be further reduced. The art disclosed herein can be preferably implemented in an embodiment where the relationship between $IEP_{Al}$ and $pH_{com}$ meets, for instance, $0.65 \leq IEP_{Al}/pH_{com} \leq 0.78$. It can be preferably implemented in an embodiment where the relationship between $IEP_{Al}$ and $pH_{com}$ typically meets $0.7 \leq IEP_{Al}/pH_{com} \leq 0.75$.

The $IEP_{Al}$ of the alumina abrasive is not particularly limited as long as it is below 8.0 and lower than the $pH_{com}$. For instance, from the standpoint of further reducing scratches, etc., an alumina abrasive having an $IEP_{Al}$ of 7.8 or lower can be preferably used. The alumina abrasive's $IEP_{Al}$ is preferably 7.6 or lower, more preferably 7.5 or lower, yet more preferably 7.4 or lower, or particularly preferably 7.0 or lower. The lower limit of the alumina abrasive's $IEP_{Al}$ is not particularly limited. From the standpoint of the polishing removal rate, etc., its $IEP_{Al}$ is generally suitably 4.0 or higher, preferably 4.5 or higher, more preferably 5.0 or higher, yet more preferably 5.5 or higher, or particularly preferably 5.8 or higher (e.g. 6.0 or higher). From the standpoint of combining a polishing removal rate and surface quality, the alumina particles have an $IEP_{Al}$ of preferably 4.0 or higher and lower than 8.0, or particularly preferably 5.0 or higher and 7.0 or lower. The alumina abrasive may have an $IEP_{Al}$ of, for instance, 6.0 or higher and 7.0 or lower. The isoelectric point of the alumina abrasive can be adjusted through, for instance, modification of the surface of alumina particles. Examples of the surface modification here include chemical modification and doping. Examples of the chemical modification here include modification by coupling agent such as an alkoxyaluminate, alkoxysilane and alkoxytitanate; modification by adsorption of a surface modifier such as polyacrylate, polyethylene glycol ester, polyethylene glycol ether, acrylic acid and methacrylic acid; functional group modification by sulfonation, carboxylation, etc. In other words, through surface modification achieved by such as subjecting the alumina particle surface at least partially to introduction of a functional group or doping with an additional element, the isoelectric point of the alumina abrasive can be adjusted to have the suitable relationships and to be in the suitable ranges as disclosed herein.

In a preferable embodiment, the alumina abrasive's $IEP_{Al}$ is higher than the isoelectric point of the material subject to polishing (or simply "$IEP_B$" hereinafter). In other words, it may be true that $IEP_B<IEP_{Al}$. The use of alumina particles having an $IEP_{Al}$ higher than $IEP_B$ can favorably improve a polishing removal rate and surface quality. For instance, the relationship between $IEP_{Al}$ and $IEP_B$ preferably satisfies $1<IEP_{Al}/IEP_B<4$, more preferably satisfies $1.2 \leq IEP_{Al}/IEP_B \leq 3$, or yet more preferably satisfies $1.5 \leq IEP_{Al}/IEP_B \leq 2.5$. The value of $IEP_{Al}$ minus $IEP_B$ (i.e. $IEP_{Al}-IEP_B$) is preferably 1.0 or greater and 5.0 or less, more preferably 1.5 or greater and 4.5 or less, or yet more preferably 2.0 or higher and 4.0 or lower. For instance, $IEP_{Al}-IEP_B$ can be 2.5 or greater and 3.5 or lower. The $IEP_B$ of the material subject to polishing can be, for instance, 2.0 to 5.0, typically 3.0 to 4.0.

As used herein, the isoelectric points of the alumina abrasive and the material subject to polishing can be determined by, for instance, zeta potential measurement based on electroacoustic spectroscopy. When the alumina abrasive is measured, specific procedures can be as follows. The alumina abrasive is dispersed in pure water to prepare an aqueous solution of 1% to 30% (by weight) abrasive for measurement. While adjusting the aqueous solution to a suitable pH, the temperature of the solution is brought to 25° C. Using an ultrasonic zeta potentiometer, particles in the solution are oscillating and the resulting electric field is detected to determine the zeta potential of the alumina abrasive. A graph is plotted with its pH on the horizontal axis and its zeta potential on the vertical axis. The pH value when the zeta potential is at zero (0) can be taken as the alumina abrasive's isoelectric point ($IEP_{Al}$). When the material subject to polishing is measured, specific procedures are as follows: Particles formed of the material subject to polishing (powdered material) are dispersed in pure water to prepare an aqueous solution of 1% to 30% (by weight) abrasive for measurement. While adjusting the aqueous solution to a suitable pH, the temperature of the solution is brought to 25° C. Using an ultrasonic zeta potentiometer, particles in the solution are oscillating and the resulting electric field is detected to determine the zeta potential of the material subject to polishing. A graph is plotted with its pH on the horizontal axis and its zeta potential on the vertical axis. The pH value when the zeta potential is at zero (0) can be taken as the isoelectric point ($IEP_B$) of the material subject, to polishing. The zeta potential measurement can be carried out, using, for instance, DT-1200 available from Dispersion Technology Inc.

For the alumina abrasive, a suitable kind can be selected and used among various known kinds of alumina particles. Examples of known alumina particles include α-alumina and intermediate alumina. The intermediate alumina here is a generic term for alumina particles excluding α-alumina, with specific examples including γ-alumina, δ-alumina, θ-alumina, η-alumina, κ-alumina and χ-alumina. Alternatively, based on classifications by manufacturing method, an alumina called fumed alumina can be used as well. Here, the fumed alumina typically refers to small alumina particles produced upon high-temperature calcination of an alumina salt. Examples of the known alumina particles further include colloidal alumina and alumina sol. For instance, hydrated alumina such as boehmite is also included in the examples of known alumina particles. The alumina abrasive in the art disclosed herein may comprise solely one such kind of alumina particles or a combination of two or more kinds.

As the alumina abrasive, it is preferable to use an alumina abrasive having an average secondary particle diameter larger than 0.01 μm. From the standpoint of the polishing removal rate, etc., the average secondary particle diameter of the alumina abrasive is preferably 0.05 μm or larger, more preferably 0.1 μm or larger, yet more preferably 0.2 μm or larger, or particularly preferably 0.3 μm or larger. The average secondary particle diameter of the alumina abrasive is not particularly limited. It is generally suitably 5 μm or smaller. For instance, from the standpoint of combining high levels of polishing removal rate and surface quality, the average secondary particle diameter of the alumina abrasive is preferably 0.05 μm or larger and 5 μm or smaller, more preferably 0.1 μm or larger and 3 μm or smaller, or particularly preferably 0.3 μm or larger and 1 μm or smaller. For instance, it can be an alumina abrasive having an average secondary particle diameter of 0.5 μm or larger and 0.8 μm or smaller. In the art disclosed herein, the average secondary particle diameter of an abrasive is determined based on laser diffraction scattering analysis. The analysis can be conducted, using a laser diffraction/scattering particle analyzer (product name LA-950) available from Horiba, Ltd.

The content of the alumina abrasive in the polishing composition is not particularly limited. It is typically 0.1% by weight or higher. From the standpoint of reducing the processing time, it is preferably 0.5% by weight or higher, more preferably 1% by weight or higher, or yet more preferably 3% by weight or higher. Here, when the alumina abrasive includes several kinds of alumina particles, the content of the alumina abrasive is the total amount of the several kinds of alumina particles contained. From the standpoint of the stability of polishing, cost reduction, etc., the content of the alumina abrasive is suitably 20% by weight or lower, preferably 15% by weight or lower, more preferably 12% by weight or lower, or yet more preferably 10% by weight or lower. The art disclosed herein can be preferably implemented in an embodiment where the content of the alumina abrasive in the polishing composition is 0.1% by weight or higher and 20% by weight or lower. For instance, it can be practiced in an embodiment where the content of the alumina abrasive is preferably 3% by weight or higher and 8% by weight or lower.

The polishing composition disclosed herein may include an abrasive formed of a material other than alumina (or a non-alumina abrasive, hereinafter). Examples of the non-alumina abrasive include an abrasive substantially formed of any one of the following: silica particles, cerium oxide particles, chromium oxide particles, titanium dioxide particles, zirconium oxide particles, magnesium oxide particles, manganese dioxide particles, zinc oxide particles, and iron oxide particles; nitride particles such as silicon nitride particles and boron nitride particles; carbide particles such as silicon carbide particles and boron carbide particles; diamond particles; and carbonates such as calcium carbonate and barium carbonate; and the like.

The content of the non-alumina abrasive is, for instance, suitably 30% by weight of the total weight of abrasive in the polishing composition or lower, preferably 20% by weight or lower, or more preferably 10% by weight or lower.

The art disclosed herein can be preferably implemented in an embodiment where the total content of the alumina abrasive is higher than 90% by weight of the total weight of abrasive in the polishing composition. The content of the alumina abrasive is more preferably 9.5% by weight or higher, yet more preferably 98% by weight or higher, or particularly preferably 99% by weight or higher. In particular, a polishing composition wherein the alumina abrasive accounts for 100% by weight of the content of the abrasive therein is preferable.

The polishing composition disclosed herein can be substantially free of diamond particles as the abrasive. Because of the super hardness, diamond particles can be a limiting factor in improving the flatness. In addition, diamond particles are generally expensive and thus may not be considered advantageous in terms of cost performance. In practical aspects, it can be less dependent on expensive materials such as diamond particles.

(Polishing Aid)

The polishing composition disclosed herein preferably includes a polishing aid. Here, the polishing aid is typically an oxidant. The polishing aid is a component that enhances the effect of polishing, and a water-soluble material typically used as the polishing aid. In a polishing process, the polishing aid presumably works to alter and embrittle the surface being polished, thereby contributing to the polishing by the abrasive. Here, the alteration is typically oxidation although it should not be limited to this effect or mechanism.

Examples of the polishing aid include peroxides such as hydrogen peroxide; nitric acid compounds such as nitric acid, its salts (iron nitrate, silver nitrate, aluminum nitrate), and its complexes (ceric ammonium nitrate, etc.); persulfuric acid compounds such as persulfuric acids including potassium peroxomonosulfate and peroxodisulfuric acid as well as its salts (ammonium persulfate, potassium persulfate, etc.); chlorine compounds such as chloric acid and its salts, perchloric acid and its salts (potassium perchlorate, etc.); bromine compounds such as bromic acid and its salts (potassium bromate); iodine compounds such as iodic acid and its salts (ammonium iodate), periodic acid and its salts (sodium periodate, potassium periodate, etc.); ferrates including ferric acid and its salts (potassium ferrate, etc); permanganates including permanganate acid and its salts (sodium permanganate, potassium permanganate, etc); chromates including chromic acid and its salts (potassium chromate, potassium dichromate, etc.); vanadates including vanadic acid and its salts (ammonium vanadate, sodium, potassium vanadate); ruthenates including perruthenic acid and its salts; molybdates including molybdic acid and its salts (ammonium molybdate, disodium molybdate, etc.); rhenates including perrhenic acid and its salts; and tungstates including tungstic acid and its salts (disodium tungstate, etc). These can be used singly as one kind or in a combination of two or more kinds. In particular, from the standpoint of the polishing removal rate, etc., permanganic acid or a salt thereof peroxide, vanadic acid or a slat thereof, and periodic acid or a salt thereof are preferable. Sodium permanganate and potassium permanganate are particularly preferable.

In a preferable embodiment, the polishing composition includes a composite metal oxide as the polishing aid.

Examples of the composite metal oxide include metal nitrates, ferrates, permanganates, chromates, vanadates, ruthenates, molybdates, rhenates and tungstates. In particular, ferrates, permanganates and chromates are more preferable; permanganates are even more preferable.

In a more preferable embodiment, as the composite metal oxide, a composite metal oxide CMO is used. As used herein, the composite metal oxide CMO refers to a composite metal oxide having a monovalent or divalent metal and a transition metal in the fourth period of the periodic table. Here, transition metals are excluded from the monovalent and divalent metals. Favorable examples of the monovalent or divalent metal include Na, K, Mg and Ca. Among them, Na and K are more preferable. Favorable examples of the transition metal in the fourth period of the periodic table include Fe, Mn, Cr, V and Ti. Among them, Fe, Mn and Cr are more preferable, with Mn being yet more preferable.

When the polishing composition disclosed herein includes a composite metal oxide as the polishing aid, it may or may not further include other polishing aid besides the composite metal oxide. The art disclosed herein can be preferably practiced in an embodiment substantially free of other polishing aid besides the composite metal oxide as the polishing aid. Here, as the composite metal oxide, a composite metal oxide CMO is preferable. An example of the polishing aid that is not a composite metal oxide is hydrogen peroxide.

The concentration (amount contained) of the polishing aid in the polishing composition is usually suitably 0.1% by weight or higher. From the standpoint of efficiently combining high levels of polishing removal rate and flatness, its concentration is preferably 0.3% by weight or higher, or more preferably 0.5% by weight or higher (e.g. 0.8% by weight or higher). From the standpoint of enhancing the smoothness, the concentration of the polishing aid is usually suitably 10% by weight or lower, preferably 8% by weight or lower, or more preferably 6% by weight or lower. The concentration of the polishing aid is preferably, for instance, 5% by weight or lower, or 3% by weight or lower.

(Other Components)

As long as the effect of the present invention is not impaired, the polishing composition disclosed herein may further include, as necessary, known additives that can be used in polishing compositions, such as chelating agent, thickener, dispersing agent, surface-protecting agent, wetting agent, pH-adjusting agent, surfactant, organic acid, organic acid salt, inorganic acid, inorganic acid salt, corrosion inhibitor, antiseptic agent, and antifungal agent. The polishing composition here typically refers to a polishing composition for super-hard materials, for instance, a polishing composition for silicon carbide substrates. The amounts of the additives contained can be suitably selected in accordance with their purposes and do not characterize the present invention; and therefore, details are omitted.

(Solvent)

The solvent used in the polishing composition is not particularly limited as long as it allows dispersion of the abrasive. As the solvent, ion-exchanged water (deionized water), pure water, ultrapure water, distilled water and the like can be preferably used. The polishing composition disclosed herein may further include, as necessary, an organic solvent that can mix uniformly with water. Examples of the organic solvent that can mix uniformly with water include short-chain alcohols and short-chain ketones. In typical, 90% by volume or more of the solvent in the polishing composition is preferably water; or more preferably, 95% by volume or more (typically 99% to 100% by volume) is water.

The pH of the polishing composition is usually suitably about 8.0 to 12. When the pH of the polishing composition is in this range, a practical polishing removal rate is likely to be obtained and its handling is easy as well. From the standpoint of obtaining greater effect of the art disclosed herein, the pH of the polishing composition is preferably 8.0 to 11, more preferably 8.0 to 10, or particularly preferably 8.5 to 9.5 (e.g. about 9.0).

<Preparation of Polishing Composition>

The method for producing the polishing composition disclosed herein is not particularly limited. The respective components of the polishing composition may be mixed, using a known mixing device. Examples of the known mixing device include blade type stirrer, ultrasonic disperser, and homo mixer. The mode of mixing these components is not particularly limited. For instance, all the components can be mixed at once or in a suitably prescribed order.

The polishing composition disclosed herein can be a one-agent type or a multi-agent type such as a two-agent type. For example, it may be formulated so that a liquid A comprising some of the components of the polishing composition and a liquid B comprising the remaining components are mixed together and used for polishing an object. Here, the liquid A typically includes components other than the solvent.

<Concentrate>

The polishing composition disclosed herein can be in a concentrated form (i.e. in a form of a concentrate of polishing slurry) before supplied to an object to be polished. The polishing composition in such a concentrated form is advantageous from the standpoint of the convenience and cost reduction during its manufacturing, distribution, storage and so on. The concentration factor can be, for instance, about 2 to 5 by volume.

Such a concentrated form of the polishing composition can be used in an embodiment such that it is diluted whenever desired to prepare a polishing slurry and the polishing slurry is supplied to an object to be polished. The dilution can be typically carried out by adding and mixing an aforementioned solvent into the concentrate. When the solvent is a mixed solvent, only some of the components of the solvent may be added for dilution or a solvent mixture consisting of the same components of the solvent at a different ratio may be added for dilution. In a multi-agent type polishing composition described later, some of the slurries may be diluted and then mixed with other slurries to prepare a polishing slurry, or the multiple slurries may be mixed first and the mixture may be then diluted to prepare a polishing slurry.

The content of the abrasive in the concentrate can be, for instance, 40% by weight or lower. From the standpoint of the stability and the filterability of the polishing composition, etc., the content of the abrasive can be usually 30% by weight or lower, or 20% by weight or lower, for instance, 15% by weight or lower. Here, examples of the stability of the polishing composition include dispersion stability of the abrasive. From the standpoint of the convenience and cost reduction during its manufacturing, distribution, storage and so on, the content of the abrasive can be, for instance, 0.2% by weight or higher, preferably 1% by weight or higher, or more preferably 5% by weight or higher, for instance, 10% by weight or higher.

<Polishing Method>

The polishing composition disclosed herein can be used in polishing an object in an embodiment comprising, for instance, the following operations:

In particular, a polishing slurry is obtained, comprising a polishing composition disclosed herein. Obtaining the polishing slurry may include preparing the polishing slurry from the polishing composition via operations such as concentration adjustment and pH adjustment. Here, dilution is an example of the concentration adjustment. Alternatively, the polishing composition may be used as is as the polishing slurry. When the polishing composition is separated in multiple agents, obtaining the polishing slurry may include mixing the agents diluting one or more agents before mixing them, and diluting the mixture after mixing them.

Subsequently, the polishing slurry is supplied to the surface of an object and polished by a typical method. For instance, an object to be polished is set in a general polishing machine and the polishing slurry is supplied via a polishing pad of the polishing machine to the surface of the object (the surface to be polished). In typical, while the polishing slurry is continuously supplied, the polishing pad is pushed against the surface of the object, and the two are moved (e.g. rotated) in coordination. Via such a polishing step, polishing object is completed.

The present description provides a method for polishing a material having a Vickers hardness of 1500 Hv or higher and a method for producing a polished object using the polishing method. The polishing method is characterized by comprising a step of polishing an object using the polishing composition disclosed herein. The polishing method according to a preferable embodiment includes a stock polishing step and a final polishing step. The stock polishing step here is a step where stock polishing is performed on an object having a Vickers hardness of 1500 Hv or higher. In a typical embodiment, the stock polishing step is a polishing step that is arranged immediately before the final polishing step. The stock polishing step can be a single sub-step polishing process or a multi sub-steps polishing process having two or more stages. Here, the final polishing step is a step where final polishing is performed on the stock polished object, referring to a polishing step that is arranged at last among polishing steps carried out using abrasive-containing polishing slurries. That is, the final polishing step refers to the most downstream polishing process. In such a polishing method comprising a stock polishing step and a final polishing step, the polishing composition disclosed herein can be used in the stock polishing step, in the final polishing step, or in each of the stock polishing step and the final polishing step.

In a preferable embodiment, the polishing step that uses the polishing composition can be a stock polishing step. The polishing composition disclosed herein can achieve a high polishing removal rate; and therefore, it is suitable as a polishing composition used in a stock polishing step (i.e. as a stock polishing composition) for the surface of a material subject to polishing. When the stock polishing step includes two or more polishing sub-steps, two or more sub-steps among them can be carried out using a polishing composition disclosed herein. The polishing composition disclosed herein can be preferably applied to an early sub-step of stock polishing. In other words, it can be preferably applied to the upstream side of stock polishing. For instance, it can also be preferably used in a first stock polishing step after the lapping step described later. In typical, it can be preferably used also in an initial polishing step.

In another preferable embodiment, the polishing step that uses the polishing composition is a final polishing step. The polishing composition disclosed herein can effectively reduce the number of scratches on the polished surface; and therefore, it can be particularly preferably used as a polishing composition used in a final polishing step for the surface of a material subject to polishing (i.e. as a final polishing composition).

The stock polishing and the final polishing can be applied to polishing either with a single-side polishing machine or with a double-side polishing machine. With respect, to the single-side polishing machine, the object to be polished is adhered to a ceramic plate with wax or held with a holder called a carrier. While supplying the polishing composition, a polishing pad is pushed against one side of the object and the two are moved (e.g. rotated) in coordination to polish the one side of the object. With respect to the double-side polishing machine, the object to be polished is held with a holder called a carrier. While supplying the polishing composition from the top, polishing pads are pushed against opposing faces of the object. The opposing polishing pads are rotated in opposite directions to simultaneously polish the both sides of the object.

The polishing pads used in the respective polishing steps disclosed herein are not particularly limited. For instance, any kind can be used among non-woven fabric types, suede types, hard polyurethane foam types, abrasive-containing types, abrasive-free types, etc.

The object polished by the method disclosed herein is typically cleaned after polished. The cleaning can be carried out using a suitable cleaning solution. The cleaning solution used is not particularly limited. A suitable kind can be selected and used among cleaning solutions that are commonly known or used.

The polishing method disclosed herein may include an optional step in addition to the stock polishing step and the final polishing step. Such a step can be a lapping step carried out before the stock polishing step. The lapping step is a step where the surface of a polishing platen, for instance, a cast iron platen, is pushed against the object to be polished. Thus, polishing pads are not used in the lapping step. The lapping step is typically carried out with an abrasive supplied between the polishing platen and the object to be polished. Here, a diamond abrasive is typically used. The polishing method disclosed herein may include an additional step before the stock polishing step, or between the stock polishing step and the final polishing step. Here, the additional step can be a cleaning step or a polishing step.

<Method for Producing Polished Object>

The art disclosed herein may include a method for producing a polished object, the method including a polishing step that uses the polishing composition; and a polished object produced by the method. In other words, the art disclosed herein provides a method for producing a polished object, the method comprising polishing an object formed of a material having a Vickers hardness of 1500 Hv or higher, supplying a polishing composition disclosed herein to the object; and a polished object produced by the method. The production method can be practiced by preferably applying the features of a polishing method disclosed herein. The production method can efficiently provide a polished object having a polished surface with greatly reduced number of scratches. Here, examples of the polished object include a silicon carbide substrate.

From the above, the present embodiment provides a polishing composition for polishing a material having a Vickers hardness of 1500 Hv or higher. This polishing composition comprises an alumina abrasive and water. The alumina abrasive has an isoelectric point that is below 8.0 and is lower than the pH of the polishing composition.

With the use of the alumina abrasive having an isoelectric point that is lower than the pH of the polishing composition and is below 8.0, while maintaining a high polishing removal rate, the number of scratches present on the polished surface can be effectively reduced.

In a preferable embodiment of the polishing composition disclosed herein, the isoelectric point of the alumina abrasive is higher than that of the material subject to polishing. The use of the alumina abrasive having a higher isoelectric point than the material subject to polishing can achieve a more favorable combination of a polishing removal rate and surface quality, that is, a favorable combination of a polishing removal rate and effect to reduce the number of scratches.

In a preferable embodiment of the polishing composition disclosed herein, the alumina abrasive has an isoelectric point of 5.0 to 7.0. In this range of alumina abrasive's isoelectric point, higher levels of polishing removal rate and surface quality can be combined.

In a preferable embodiment of the polishing composition disclosed herein, its pH is 8.0 or higher. When the alumina abrasive having an aforementioned isoelectric point is used in a polishing composition having such a pH, the effect of this embodiment can be more favorably obtained.

In a preferable embodiment of the polishing composition disclosed herein, it further includes a polishing aid. With the polishing aid contained in the polishing composition, higher levels of polishing removal rate and surface quality can be combined.

In a preferable embodiment of the polishing composition disclosed herein, the material subject to polishing is silicon carbide. In the polishing composition used for polishing silicon carbide, the effect of applying this embodiment can be more favorably obtained.

EXAMPLES

Several working examples related to the present invention are described below, but the present invention is not limited to these examples. In the description below, "%" is by weight unless otherwise informed.

Preparation of Polishing Compositions

Working Example

An alumina abrasive (average secondary particle diameter: 0.4 μm, $IEP_{Al}$ 6.5), potassium permanganate ($KMnO_4$) as a polishing aid and deionized water were mixed to prepare a polishing composition. The content of alumina abrasive was 6% and the content of $KMnO_4$ was 1%. The polishing composition was adjusted to pH 9.0 with KOH. As the alumina abrasive, commercial alumina particles were used upon surface modification. The isoelectric point of the alumina abrasive was determined in accordance with the method based on zeta potential measurement described earlier.

Comparative Example

Commercial alumina particles (average secondary particle diameter: 0.4 μm, $IEP_{Al}$ 9.0) were used as they were. Otherwise in the same manner as Working Example, a polishing composition was prepared.

<Evaluation of Polishing Removal Rates>

Using the polishing compositions obtained, surfaces of SiC wafers, which in advance were subjected to lapping with a diamond abrasive having an average particle diameter of 5 μm, were subjected to polishing under the conditions shown below. According to the equations (1) and (2) shown below, the polishing removal rates were determined. The results are shown in the corresponding columns in Table 1. It is noted that the isoelectric point of SiC is around 3 to 4 when determined in accordance with the method based on zeta potential measurement.

$$\text{Polishing removal (cm)} = \text{difference in weight of SiC wafer before and after polishing (g)/density of SiC } (g/cm^3)(=3.21 \text{ g/cm}^3)/\text{area polished (cm}^2) (=19.62 \text{ cm}^2) \quad (1)$$

$$\text{Polishing removal rate (nm/h)} = \text{polishing removal (cm)} \times 10^7/\text{polishing time} (=1 \text{ h}) \quad (2)$$

[Polishing Conditions]

Polishing machine: single-side polishing machine, model EJ-380IN, available from Engis Japan Corporation Polishing pad: trade name SUBA800 available from Nitta Haas Inc.

Polishing pressure: 300 g/cm²
Platen rotational speed: 80 rpm
Polishing time: 1 hour (h)
Head rotational speed: 40 rpm
Supply flow rate of polishing slurry: 20 mL/min (one-way)
Temperature of polishing slurry: 25° C.
Polishing object: SiC wafer (n-type conduction, crystal type: 4H 4° off) 2 inches <Scratches>

With respect to the surface of the polished object according to each Example, using a compound wafer surface defect tester (available from Softworks Co., Ltd.), the entire surface of the SiC wafer was analyzed to determine the number of scratches measuring 10 mm or longer present in 55 mm by 40 mm (schlieren image) (the number of lines per face). The results are shown in the column headed "Scratches" in Table 1.

TABLE 1

| | Abrasive | | | Polishing | |
|---|---|---|---|---|---|
| | Kind | Amount contained (%) | Isoelectric point | pH | removal rate (nm/h) | Scratches (# of lines/face) |
| Work. Ex. | Alumina | 6 | 6.5 | 9.0 | 1500 | 0 |
| Com. Ex. | Alumina | 6 | 9.0 | 9.0 | 1600 | 2 |

As shown in Table 1, in Example using an alumina abrasive having an isoelectric point lower than the pH of the polishing composition, the polishing removal rate was comparable to that of Comparative Example, yet a better result was obtained with respect to the number of scratches. This result indicates that according to a polishing composition using an alumina abrasive having an isoelectric point lower than the pH of the polishing composition, while maintaining a high polishing removal rate, a polished surface in high quality with fewer scratches can be obtained.

Although specific embodiments of the present invention have been described in detail above, these are merely for illustrations and do not limit the scope of claims. The art according to the claims includes various modifications and changes made to the specific embodiments illustrated above.

INDUSTRIAL APPLICABILITY

This invention can provide a polishing composition capable of combining high levels of polishing removal rate and surface quality.

The invention claimed is:

1. A polishing composition used for polishing a material having a Vickers hardness of 1500 Hv or higher, the polishing composition comprising:
    an abrasive consisting of an alumina abrasive;
    an oxidizing agent as a polishing aid; and
    water,
    wherein:
    the oxidizing agent is one or more permanganates;
    the alumina abrasive has an isoelectric point that is below 8.0 and is lower than the pH of the polishing composition; and
    the isoelectric point of the alumina abrasive is higher than an isoelectric point of the material subject to polishing.

2. The polishing composition according to claim 1, wherein the isoelectric point of the alumina abrasive is 5.0 to 7.0.

3. The polishing composition according to claim 1, wherein the pH is 8.0 or higher.

4. The polishing composition according to claim 1, wherein the material subject to polishing is silicon carbide.

5. The polishing composition according to claim 1, wherein $pH_{com}$ minus $IEP_{A1}$ ($pH_{com}$-$IEP_{A1}$) is 4.5 or less, wherein the $pH_{com}$ represents the pH of the polishing composition and the $IEP_{A1}$ represents the isoelectric point of the alumina abrasive.

6. The polishing composition according to claim 1, wherein a relationship between $IEP_{A1}$ and $pH_{com}$ satisfies $0.6 \leq IEP_{A1}/pH_{com} \leq 0.8$, wherein the $IEP_{A1}$ represents the isoelectric point of the alumina abrasive and the $pH_{com}$ represents the pH of the polishing composition.

7. The polishing composition according to claim 1, wherein a relationship between $IEP_{A1}$ and $IEP_{B}$ satisfies $1.2 \leq IEP_{A1}/IEP_{B} \leq 3$, wherein the $IEP_{A1}$ represents the isoelectric point of the alumina abrasive and the $IEP_{B}$ represents the isoelectric point of the material subject to polishing.

8. The polishing composition according to claim 1, wherein $IEP_{A1}$ minus $IEP_{B}$ ($IEP_{A1}$-$IEP_{B}$) is 1.5 or greater and 4.5 or less, wherein the $IEP_{A1}$ represents the isoelectric point of the alumina abrasive and the $IEP_{B}$ represents the isoelectric point of the material subject to polishing.

9. A method for producing a polished object, the method comprising polishing an object having a Vickers hardness of 1500 Hv or higher by supplying the polishing composition according to claim 1 to the object.

10. The method according to claim 9, wherein the object is formed of diamond, sapphire, silicon carbide, boron carbide, zirconium carbide, tungsten carbide, silicon nitride, or gallium nitride.

11. The method according to claim 9, wherein the object has a surface to be polished, the surface being formed of silicon carbide.

12. The method according to claim 9, wherein the object has a surface to be polished, the surface being a single crystal silicon carbide.

* * * * *